United States Patent [19]

Dearnaley

[11] Patent Number: 5,501,745
[45] Date of Patent: Mar. 26, 1996

[54] LOW TEMPERATURE METHOD FOR MAKING A PHOTOVOLTAIC MATERIAL

[75] Inventor: Geoffrey Dearnaley, San Antonio, Tex.

[73] Assignee: Southwest Research Institute, San Antonio, Tex.

[21] Appl. No.: 251,760

[22] Filed: May 31, 1994

[51] Int. Cl.$^6$ ............................................. H01L 31/20
[52] U.S. Cl. ................... 136/258; 257/53; 257/55; 427/74; 427/487; 427/496; 427/497; 427/503; 427/527; 427/595; 437/4; 437/16; 437/18; 437/100; 437/101; 437/108
[58] Field of Search ........................... 437/4, 16, 18, 437/100–101, 108; 427/74, 487, 496–497, 503, 527, 595; 136/258 AM; 257/53, 55

[56] References Cited

U.S. PATENT DOCUMENTS

| | | | |
|---|---|---|---|
| 4,313,254 | 2/1982 | Feldman et al. | 437/4 |
| 4,365,107 | 12/1982 | Yamauchi | 136/258 |
| 4,637,869 | 2/1987 | Glocker et al. | 204/192.11 |
| 4,786,608 | 11/1988 | Griffith | 437/24 |
| 5,089,289 | 2/1992 | Ito | 427/527 |

OTHER PUBLICATIONS

"American Heritage Dictionary"—Second Edition—Houghton Mifflin Co. (1982), pp. 630 and 1140.
G. Compagnini, et al., *Properties of Fully Implanted Amorphous $Si_xC_{1-x}$:H Alloys*, Nuclear Instruments and Methods in Physics Research B80/81, 978–981, 1993.
H. J. Stein, et al., *Controlled Hydrogenation of Amorphous Silicon at Low Temperatures*, Appl. Phys. Lett., 604–606, May, 1979.
P. J. Martin, et al., *Optical Properties of Thin Amorphous Silicon and Amorphous Hydrogenated Silicon Films Produced by Ion Beam Techniques*, Thin Solid Films, 141–147, 1983.
A. Kasdan et al., *Summary Abstract: Ion Beam Control of Morphology During the Growth $aS_1H_x$ Thin Films*, J. Vac. Sci. Technol., 437–438, Apr.–Jun. 1983.

Primary Examiner—Aaron Weisstuch
Attorney, Agent, or Firm—Rosenblatt & Redano

[57] ABSTRACT

The present invention relates to a low temperature method for making a photovoltaic material. In particular, the present invention describes a low temperature method for the deposition in vacuo of successive layers of materials required for a photovoltaic device. The present invention uses ion beam assisted processes in which a selected silicon containing precursor film is controllably converted to an amorphous silicon and carbon mixture. Ion beams are used to control the hydrogen content and thereby control the electrical conductivity of the material. The present invention further comprises the addition of a dopant and the deposition of the electrical contacts, both by thermal evaporation.

25 Claims, 8 Drawing Sheets

LOW TEMPERATURE METHOD FOR MAKING A PHOTOVOLTAIC MATERIAL

BACKGROUND OF THE INVENTION

1. Field of the Invention

The present invention relates to a low temperature method for making a photovoltaic material. In particular, the present invention describes a low temperature method for the deposition in vacuo of successive layers of materials required for a photovoltaic device. The present invention uses ion beam assisted processes in which a selected silicon containing precursor film is controllably converted to an amorphous silicon and carbon mixture. Ion beams are used to control the hydrogen content and thereby control the electrical conductivity of the material. The present invention further comprises the addition of a dopant and the deposition of the electrical contacts, both by thermal evaporation.

2. Description of the Prior Art

Photovoltaic materials, such as solar cells, have been made from amorphous hydrogenated mixtures of silicon and carbon. Prior art methods for making photovoltaic materials have involved depositing such amorphous hydrogenated mixtures by plasma activated chemical vapor deposition (PA CVD) from gaseous mixtures of silane and hydrocarbon. In the prior art, electrical doping of the photovoltaic material has been achieved by introducing diborane, phosphine, or arsine vapor into the plasma. Prior art substrate materials have comprised glass or metal.

There are several drawbacks to prior art methods of photovoltaic material fabrication. The gases used are environmentally hazardous and dangerous to handle. The temperature of deposition is typically at least 250° C. This high temperature precludes the use of polymers as substrate materials. Polymers are cheaper and more flexible than the glass and metal used in the prior art.

Prior art methods of photovoltaic material fabrication have also comprised the forming of electrical connections by evaporation of metal film, such as nickel or aluminum. The vacuum evaporation of metal contacts and electrodes is carried out in a separate facility from the PA CVD in prior art methods of fabrication. This use of separate facilities increases the cost of manufacturing photovoltaic materials using the methods of the prior art.

SUMMARY OF THE INVENTION

The present invention overcomes these drawbacks of the prior art by providing a nontoxic, low temperature method of making photovoltaic materials that can take advantage of polymers as substrate material. Also, the present invention provides for the deposition of electrical connections by thermal evaporation that need not be performed in a separate facility from where the doping takes place.

The present invention provides a method for making photovoltaic material in which a selected silicon containing precursor film is controllably converted to the required amorphous silicon and carbon mixture, known in the prior art as $\alpha\text{-Si}_x\text{C}_{1-x}\text{:H}$. In this designation, x is the proportion of silicon relative to carbon. The photovoltaic material made by the process of the present invention has three regions or layers, a bottom or first conducting layer, an intermediate layer, and a top or second conducting layer. The top and bottom conducting layers are of opposite conductivity.

It is known in the prior art that the factor that most strongly controls the electrical conductivity of this class of materials is the hydrogen content. In the PA CVD process of the prior art, hydrogen content is not easily controlled. The present invention is advantageous because it provides for the control of hydrogen content by use of a beam of hydrogen ions or by use of another ion beam for conversion of the precursor. In the present invention, the value of x is a control parameter that is interrelated to the proportion of hydrogen in the layer or film. The proportions of hydrogen and silicon, together, determine the electrical resistivity and optical properties of the photovoltaic material. In a preferred embodiment of the present invention, the value of x will lie in a range of 0.3–0.5.

The first step of the present invention is coating a substrate with a transparent conducting film. This step may take place outside of a vacuum at atmospheric pressure conditions.

The next sequence of steps is aimed at depositing a first p-type conducting layer on the transparent conducting film. This sequence of steps may be performed at a single work station. The next step of the present invention is directing a vapor stream of carbonaceous precursor in a vacuum toward the conducting film. The phrase "in a vacuum," as used herein, is intended to mean pressure conditions less than $10^{-4}$ Torr.

The next step of the present invention is exposing the conducting film and precursor to a flux of atoms of a species suitable to produce a p-type conducting layer in the film in a vacuum. Simultaneously with exposing the conducting film and precursor to a flux of atoms, the conducting film and precursor are bombarded with an ion beam having energies in the range of 1–20 KeV for a sufficient period of time to rupture a substantial number of carbon to hydrogen (C-H) bonds in the precursor and to form an amorphous p-type carbonaceous residue. This results in a solid amorphous residue having a thickness of 100–200 nm that consists mainly of carbon with 10–15 atomic percent hydrogen and preferably 1–10 atomic percent boron dopant. This film possesses high electrical conductivity required for the p-type electrode.

In a preferred embodiment, the substrate is then transported to a second work station where the next sequence of steps aimed at depositing the intermediate layer of the photovoltaic material are performed. In the next step of the present invention, a vapor stream of siloxane precursor is directed toward the p-type conductor layer in a vacuum. Simultaneously with directing a vapor stream of siloxane precursor toward the p-type conductor layer, the p-type conductor layer and precursor are bombarded with a beam of hydrogen ions having energies in the range of 0.5–2.0 KeV for a sufficient period of time to produce a siloxane film.

The purpose of this stage of deposition is to achieve a high resistivity film without the use of dopant. The incorporation of silicon raises the optical band gap. It is the aim of the present invention that by controlling the silicon and hydrogen content in the manner described above, an optical band gap of approximately 1.5 eV can be achieved. This is viewed as the optimum optical band Gap for the absorption of solar energy.

The optical band gap may be determined by means known as a Tauc Plot. The Tauc Plot method is well known in the atomic physics arts. The Tauc Plot comprises measuring the optical absorption of the film to be used as a photovoltaic material at several different wavelengths. The square root of the product of the measured absorption coefficient and the photon energy is plotted as a function of the absorption energy. This plot is extrapolated to the Y-axis to determine the optical band gap. The value of the optical band gap is a function of the percentage of hydrogen and of silicon in the carbonaceous film.

In a preferred embodiment, the substrate may be moved to a third work station for the deposition of the top conducting layer. The next step of the present invention is directing a vapor stream of carbonaceous precursor at the siloxane film in a vacuum. The next step of the present invention is exposing the siloxane film and precursor to a flux of atoms of the species suitable to produce an n-type conducting layer above the siloxane film in a vacuum. Simultaneously with the preceding step, the carbonaceous precursor is bombarded with a beam of argon or nitrogen ions for a sufficient amount of time to produce an n-type conductor layer with a low-hydrogen content.

In a preferred embodiment, the substrate is then transported to a fourth work station where an evaporated stream of metal atoms is deposited onto the n-type conductor layer in at least two defined strips. This step may also be carried out at the third work station.

The above-described method of the present invention will produce a photovoltaic material whose bottom layer, intermediate layer, and top layer form a p-i-n structure. By making a minor modification in two of the above steps, the present invention can produce a photovoltaic material having an n-i-p structure. The first modification involves exposing the conducting film and precursor to a flux of atoms of a species suitable to produce an n-type conducting layer, rather than a p-type conducting layer, in the film in a vacuum. The second change involves exposing the siloxane film and carbonaceous precursor to a flux of atoms of a species suitable to produce a p-type conducting layer, rather than an n-type conducting layer, in the layer above the siloxane film in a vacuum.

The temperature at which the steps of the present invention are carried out is dependent upon the materials used in practicing the invention. The first material constraint is the substrate material. The temperature must be low enough such that the particular substrate material does not reach its softening temperature. The next material constraint is the precursor material. As explained above, the precursors are volatilized and then condensed on the surface to be coated. The surface to be coated must be held at a temperature sufficiently below the vaporization temperature of the particular precursor material, so that the condensed precursor molecules will not evaporate. This can be achieved by maintaining the temperature of the surface to be coated at least 40°–50° C. below the vaporization temperature of the precursor. In a preferred embodiment of the present invention, 80°–90° C. is believed to be a preferred temperature range for practicing the present invention with siloxane and carbonaceous precursors, as disclosed above. An alternative temperature range for practicing this embodiment of the invention is less than 90° C., if the narrower range cannot be achieved.

The temperature at which the present invention is practiced can be controlled by controlling the amount of heat that is transferred to the vacuum chamber via thermal radiation from (1) the reservoir from which the precursor is released by vaporization, or (2) the ion source. In a preferred embodiment, the amount of heat transferred by thermal radiation from the reservoir may be controlled by inserting a planar heat shield having a high thermal resistivity between the reservoir and the substrate. The heat shield would have a slot or aperture through which the stream of vapor could be directed toward the substrate material. The surface area of the aperture would be proportional to the amount of heat transferred by thermal radiation.

DESCRIPTION OF THE PREFERRED EMBODIMENTS

Figure 1A:
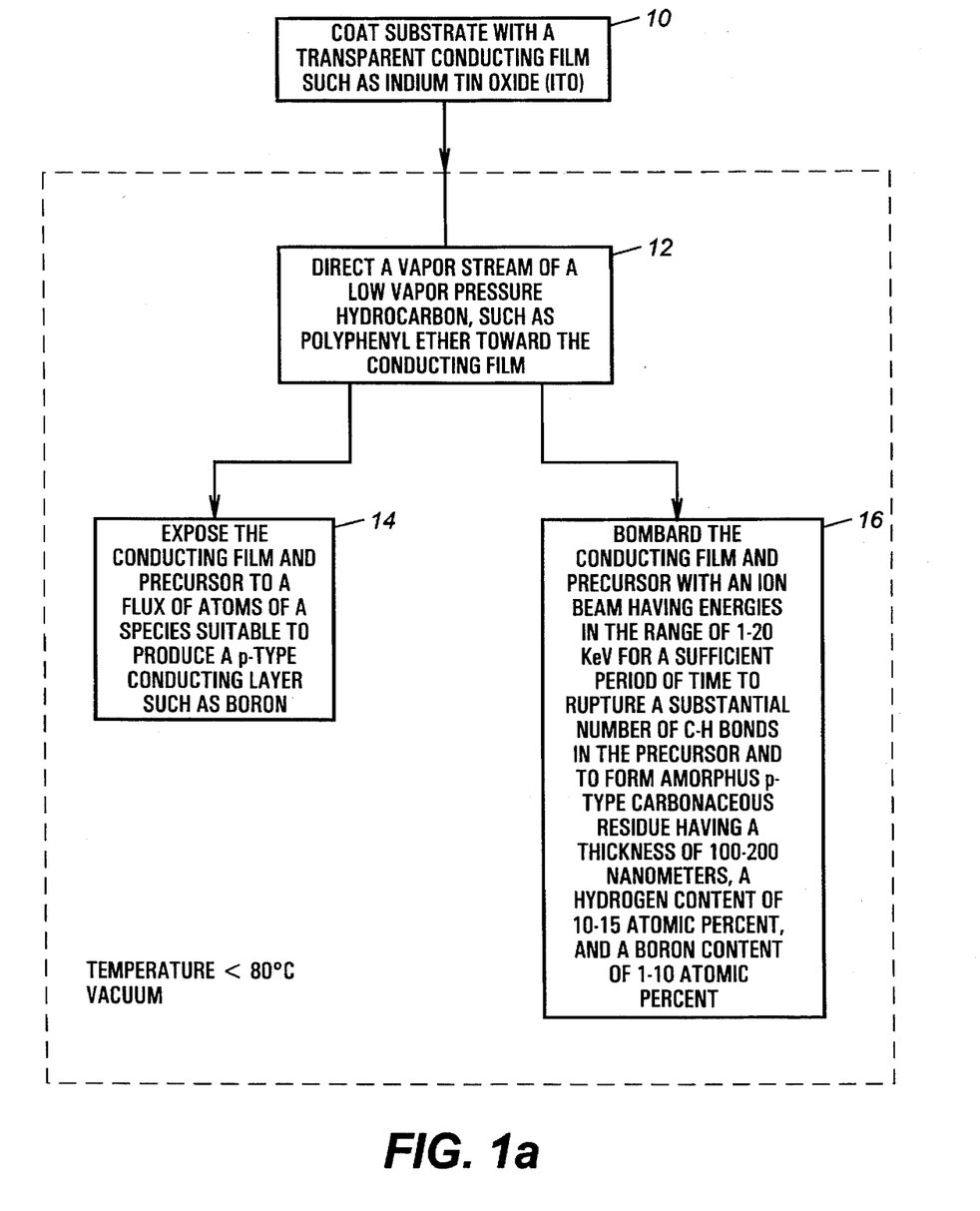
FIG 1a is block diagram of the steps of one embodiment of the present invention involved in the deposition of the first conducting layer.
Figure 1B:
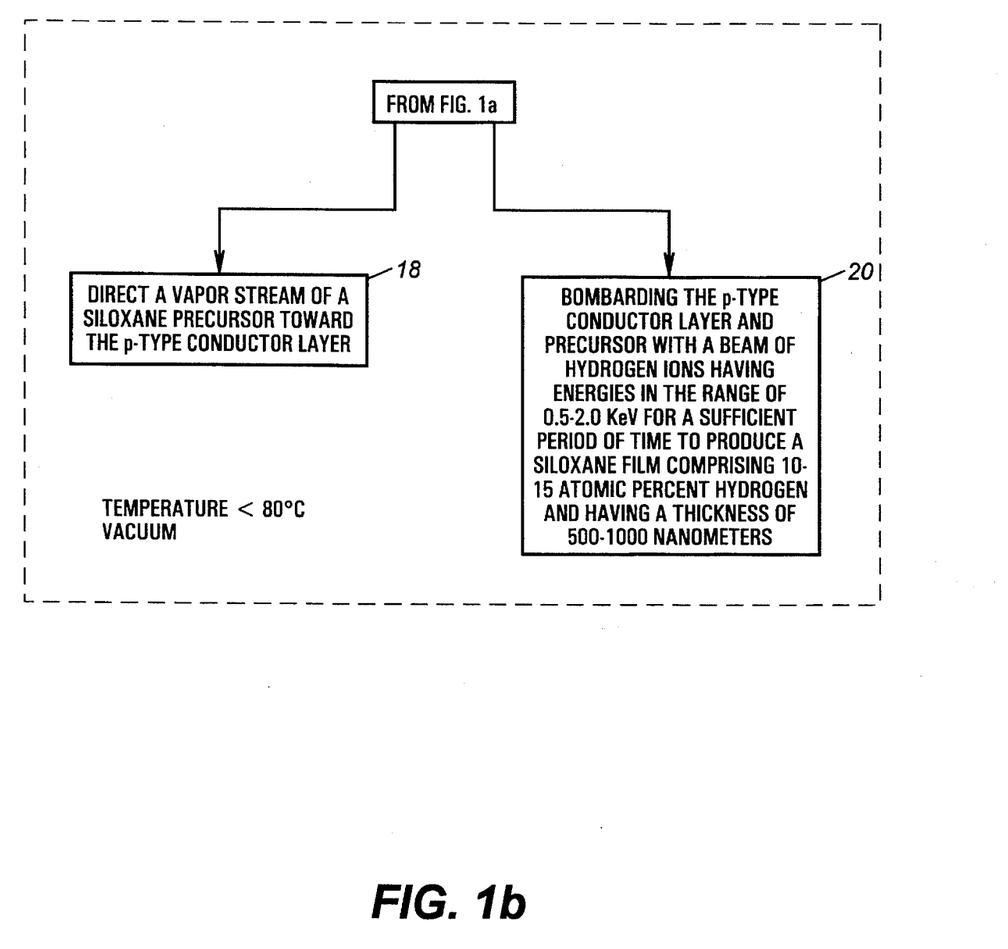
FIG. 1b is a block diagram of the steps of one embodiment of the present invention involved in the deposition of the intermediate layer.
Figure 1C:
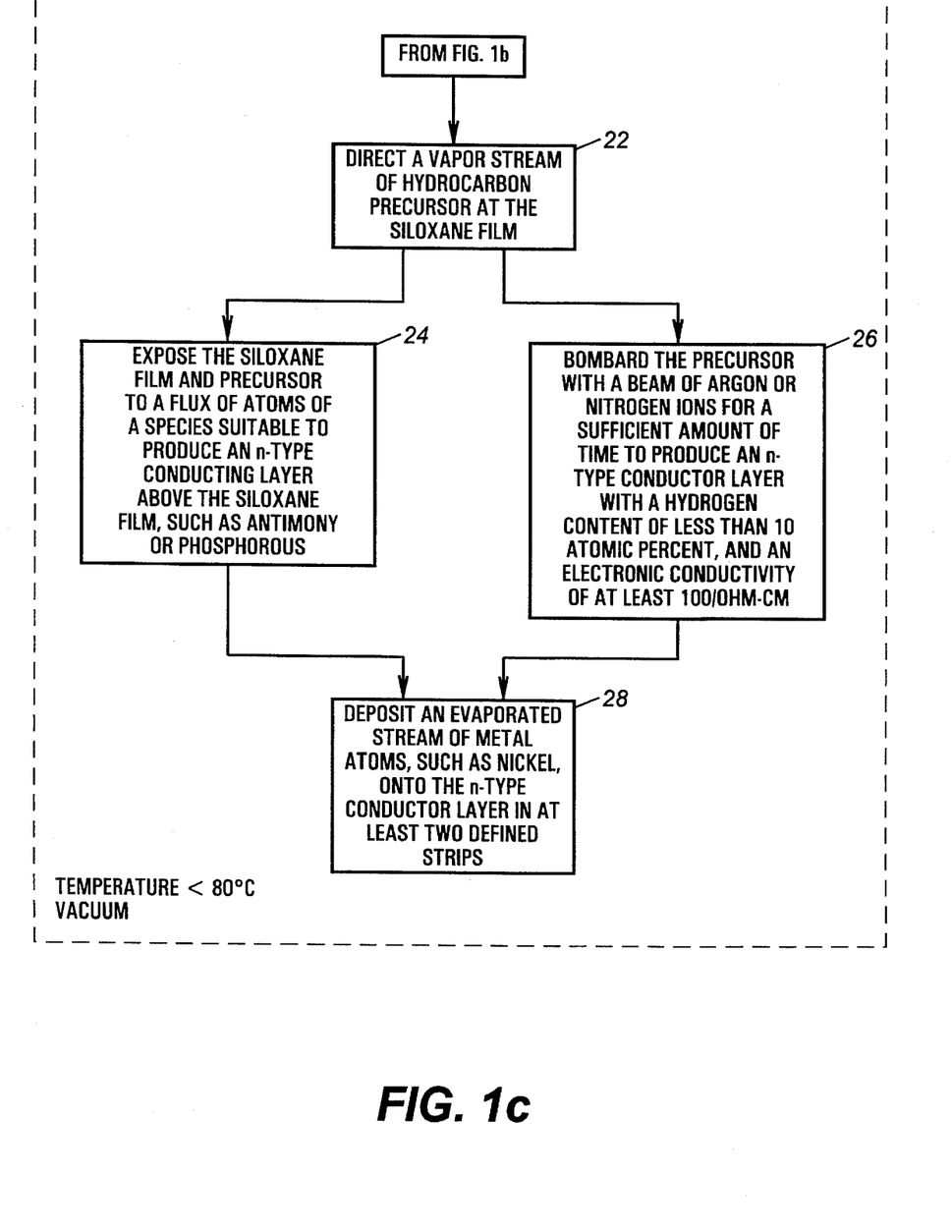
FIG. 1c is a block diagram of the steps of one embodiment of the present invention involved in the deposition of the top conducting layer and the metallic conductor strips.
Figure 2A:
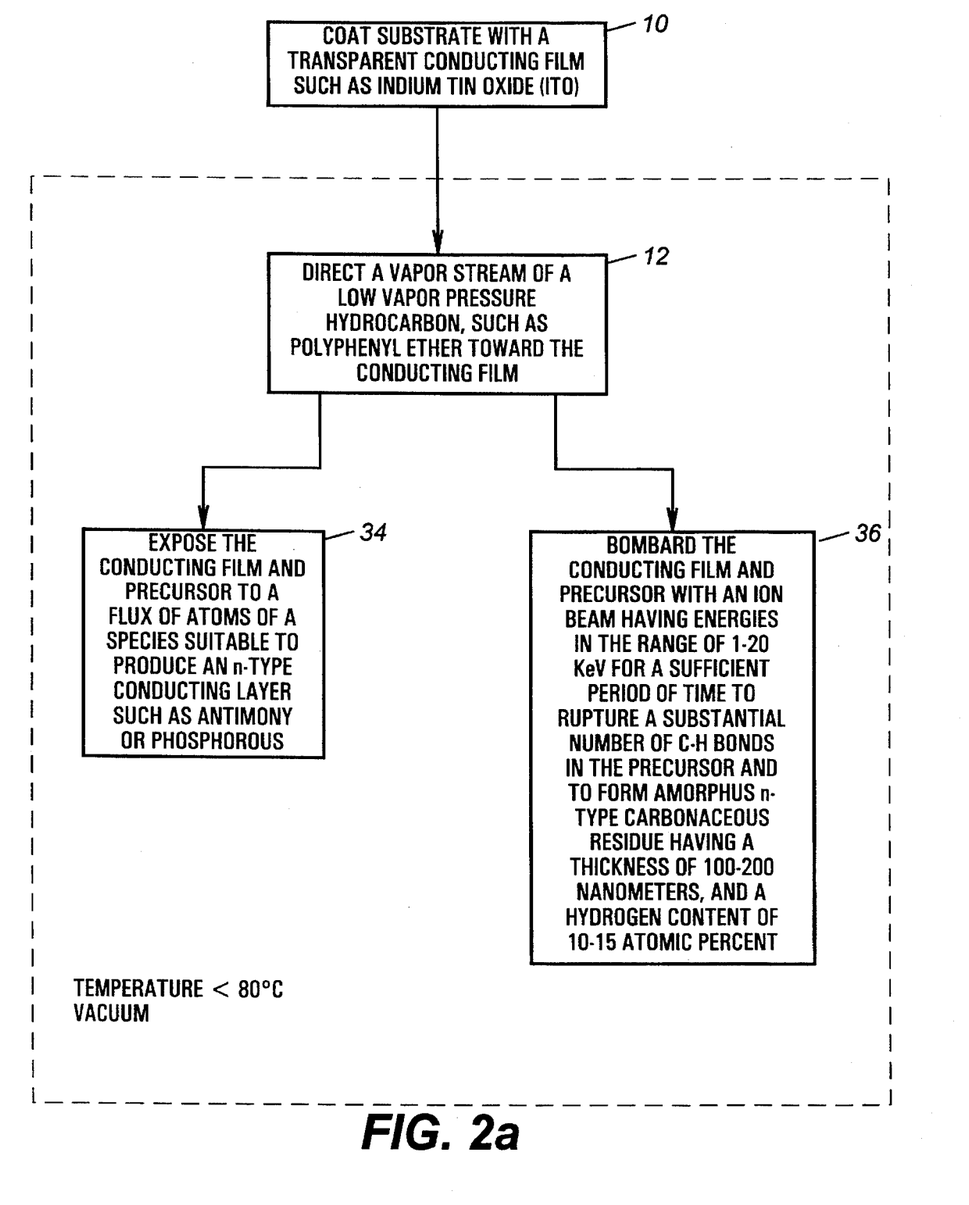
FIG. 2a is block diagram of the steps of a second embodiment of the present invention involved in the deposition of the first conducting layer.
Figure 2B:
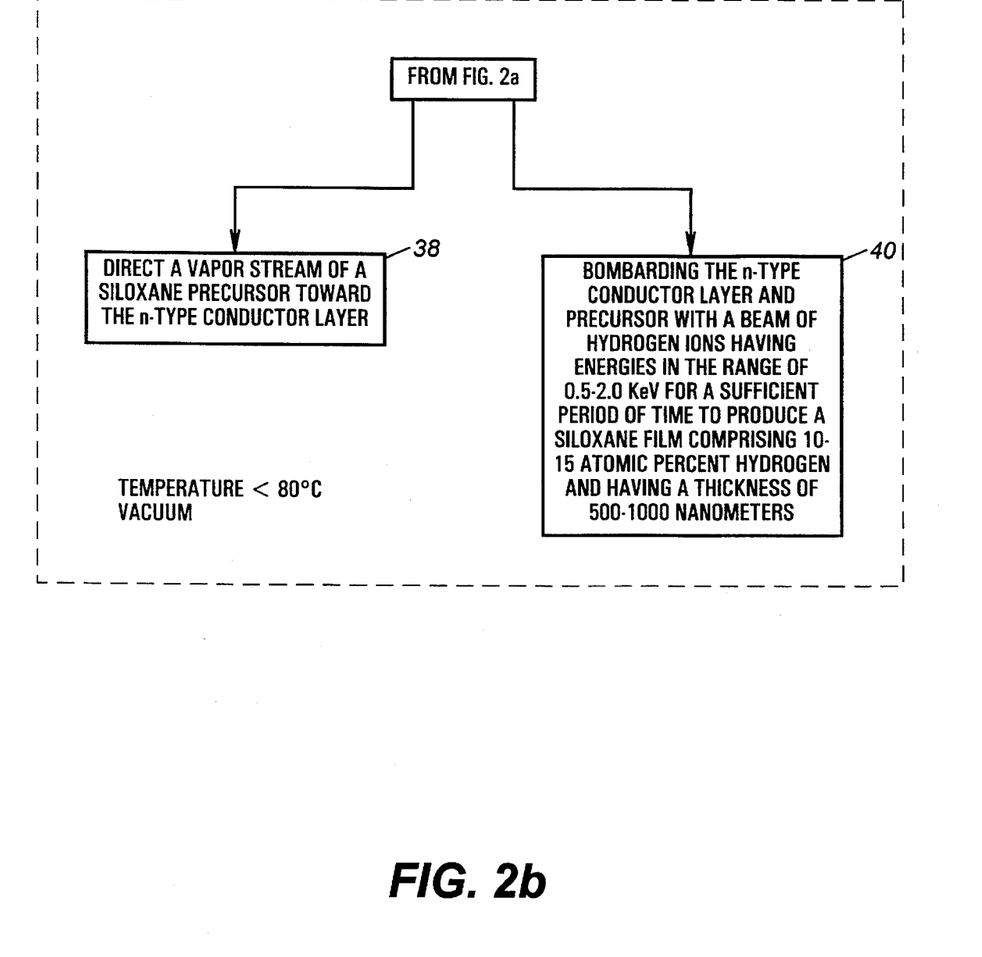
FIG. 2b is a block diagram of the steps of a second embodiment of the present invention involved in the deposition of the intermediate layer.
Figure 2C:
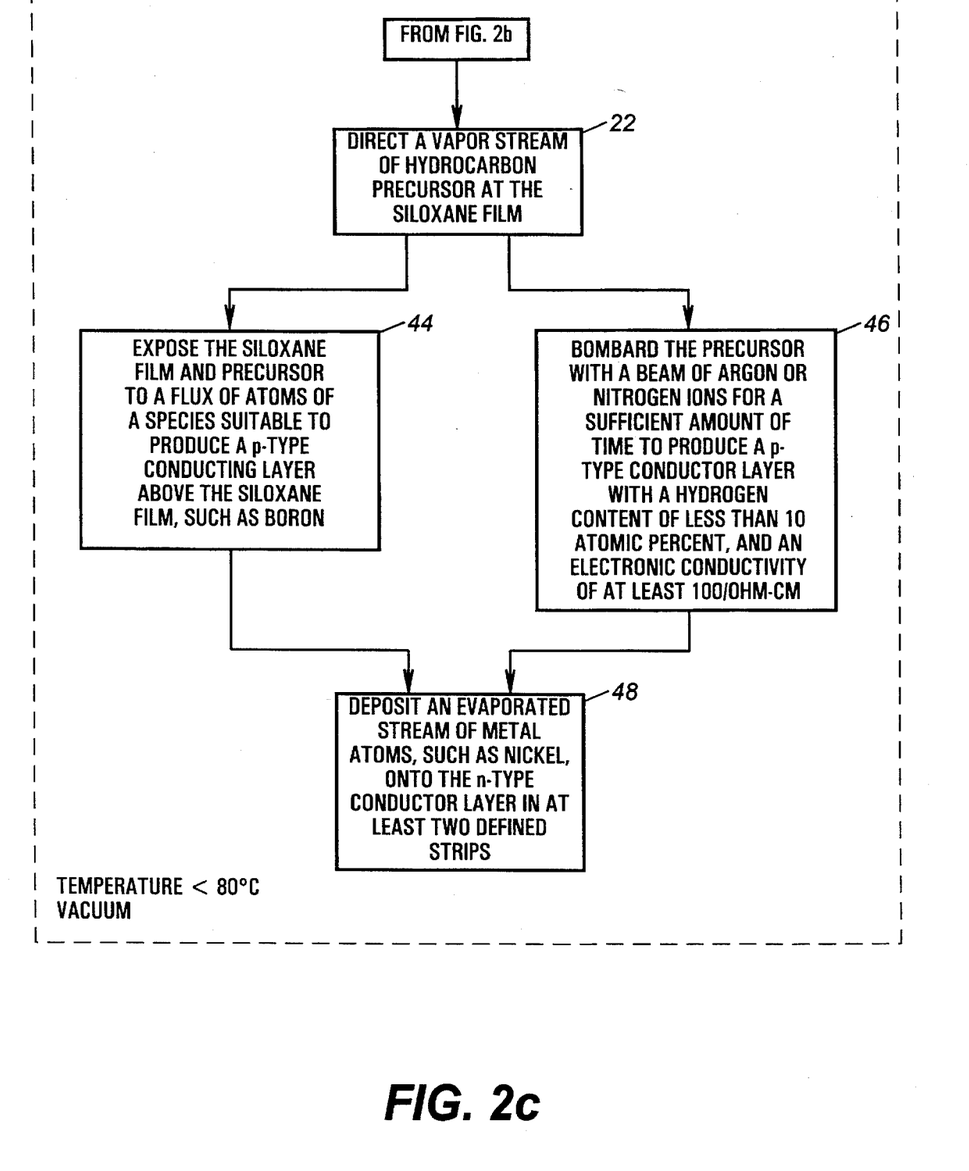
FIG. 2c is a block diagram of the steps of a second embodiment of the present invention involved in the deposition of the top conducting layer and the metallic conductor strips.

There are two major embodiments of the present invention. The first major embodiment is a method of producing a photovoltaic material with a p-i-n structure. This method is depicted in FIGS. 1a–1c. The second embodiment is a method for producing a photovoltaic material with an n-i-p structure. This method is depicted in FIGS. 2a–2c. The two embodiments differ in the selection of the species of doping atoms used during the deposition of the bottom and top conducting layers.

As shown in block 10 of FIG. 1a, the first step of the first embodiment of the present invention is coating a substrate with a transparent conducting film such as indium tin oxide (ITO). In a preferred embodiment, ITO is sprayed onto the surface of the substrate using a solution of mixed chlorides of tin and indium in a ratio of approximately 10/1. In a preferred embodiment, the substrate material is glass which is maintained a temperature of 400°–500° C. during the coating process such that the mixed chlorides of tin and indium are converted to a mixed oxide. In an alternative embodiment, an aluminum doped zinc oxide may be used in place of ITO.

In the embodiments of the invention described herein, it is preferred that all ion and atom fluxes are directed vertically upward toward the substrate material to be processed into a photovoltaic material. It is also preferred that the substrate material be horizontally transported above the sources of ion and atom fluxes described in the present invention.

As shown in FIG. 1a, the second, third, and fourth steps of the first embodiment of the present invention take place in a vacuum. The next step of this embodiment of the invention is directing a vapor stream of a low vapor pressure carbonaceous precursor, such as polyphenyl ether, toward the conducting film, as shown in block 12 of FIG. 1a. In a preferred embodiment, the polyphenyl ether is released from an electrically heated vessel equipped with a nozzle to direct the vapor stream uniformly toward the conducting film.

The next two steps of the first embodiment of the present invention are performed simultaneously. The first of these steps, as shown in block 14 of FIG. 1a, is exposing the conducting film and precursor to a flux of atoms of a species suitable to produce a p-type conducting layer. In a preferred embodiment, the flux of atoms used to produce a p-type conducting layer are boron atoms. In a preferred embodiment, the boron atoms are released as a controllable flux from an electron beam heated hearth. The rate of arrival of boron atoms is dependent upon the electron beam power that is supplied. The temperature of the hearth will be regulated so that the flux of boron atoms is suitable for the speed at which the conducting film and precursor pass through the boron atom flux.

The next step of the first embodiment of the present invention, as shown in block 16 of FIG. 1a, is bombarding the conducting and precursor with an ion beam having energies in the range of 1–20 KeV for a sufficient period of time to rupture a substantial number of C-H bonds in the precursor and to form amorphous p-type carbonaceous residue having a thickness of 100–200 nanometers. In a preferred embodiment, the ion beams used to bombard the precursor comprise argon or nitrogen ions. In a preferred embodiment, the argon or nitrogen ions are produced in a Kaufman-type ion source. In a preferred embodiment, the argon or nitrogen ions have an energy level of approximately 10 KeV. In another preferred embodiment, the amorphous p-type carbonaceous residue comprises approximately 10–15 atomic percent hydrogen and approximately 1–10 atomic percent boron.

In the first embodiment of the present invention, the coated substrate may then be moved to a second work station. The steps carried out at the second work station are performed at vacuum conditions, as shown in FIG. 1b.

The next step of the present invention, as shown in block 18 of FIG. 1b, is directing a vapor stream of siloxane precursor toward the p-type conductor layer. In a preferred embodiment, the siloxane precursor is generated by vaporization at a temperature of approximately 145° C. from pentaphenyl tri-methyl siloxane.

Figure 4:
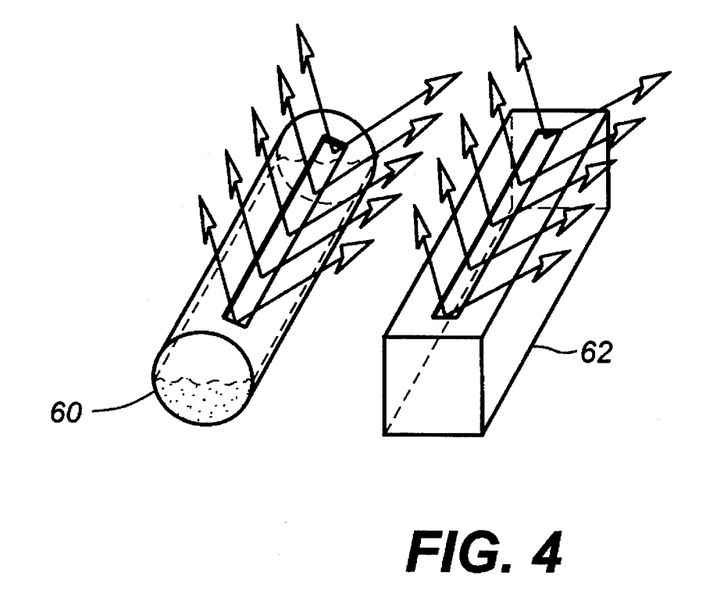
FIG. 4 is a schematic representation of an apparatus for use in practicing the present invention.

The next step of the first embodiment of the present invention, as shown in block 20 of FIG. 1b, is bombarding the p-type conductor layer and precursor with a beam of hydrogen ions having energies in the range of 0.5–2.0 KeV for a sufficient period of time to produce a siloxane film comprising 15–40 percent hydrogen and having a thickness of 500–1000 nanometers. In a preferred embodiment, this ion bombardment takes place at a temperature in the range of 50°–70° C. The atomic percent of hydrogen is controllable by controlling the magnitude of the ion flux and/or the temperature of the substrate. The steps depicted in blocks 18 and 20 of FIG. 1b are performed simultaneously. These steps may be performed using an apparatus of the type depicted in FIG. 4. The vapor stream of siloxane precursor comes from a precursor vapor source 60. The hydrogen ions come from an ion source 62. The deposition steps depicted in blocks 18 and 20 of FIG. 1b are directed toward producing a high resistivity film without the use of a dopant.

It is an objective of the present invention that the residual hydrogen content in the central region or the "i" region of the photovoltaic material will be higher than the residual hydrogen content in the p-type or the n-type electrode layers. The preferred method for determining residual hydrogen content is by elastic recoil detection, a method well known in the atomic physics art. In the elastic recoil detection method, energetic heavy ions are projected toward a target at a grazing angle to the surface of the target. These ions cause the recoil of protons which are detectable in a particle detector, such as a silicon surface barrier detector. The elastic recoil detection method can be used quantitatively in conjunction with other electrical measurements to determine residual hydrogen content.

In the present invention, the residual hydrogen content can be controlled by the selection of a precursor with an appropriate carbon-to-hydrogen ratio (C:H ratio). In a preferred embodiment, the C:H ratio is in the range of 1:1–1:2. The second means of controlling hydrogen content is regulating the hydrogen ion flux used to bombard the condensed film of precursor material. Approximately 5–10 atomic percent of additional hydrogen can be incorporated into a film by the use of ion implantation. Selectively controlling the hydrogen content provides for control of the optical band gap as well as the electrical resistivity in the intermediate layer.

Silicon is used to raise the optical band gap in the intermediate layer to a level that is considered optimum for the absorption of solar energy. In a preferred embodiment, the siloxane film has an optical band gap of approximately 1.5 eV. In a preferred embodiment, the silicon to carbon, Si:C, ratio is controlled to achieve the desired optical band gap.

In another embodiment, the desired optical band gap is achieved by using several thin successive intermediate layers having different Si:C ratios. Different Si:C ratios are achieved by using different precursors, such as polydimethyl siloxane and pentaphenyl trisiloxane. In this embodiment, the substrate is moved such that a vapor stream from a selected precursor is directed toward the first conducting layer during the formation of each of the successive intermediate layers. In this embodiment, the successive intermediate layers are preferably 1–5 nanometers thick. The overall Si:C ratio in the intermediate layers can be controlled by the selection of precursor as well as by the thickness of each successive layer.

Figure 3:
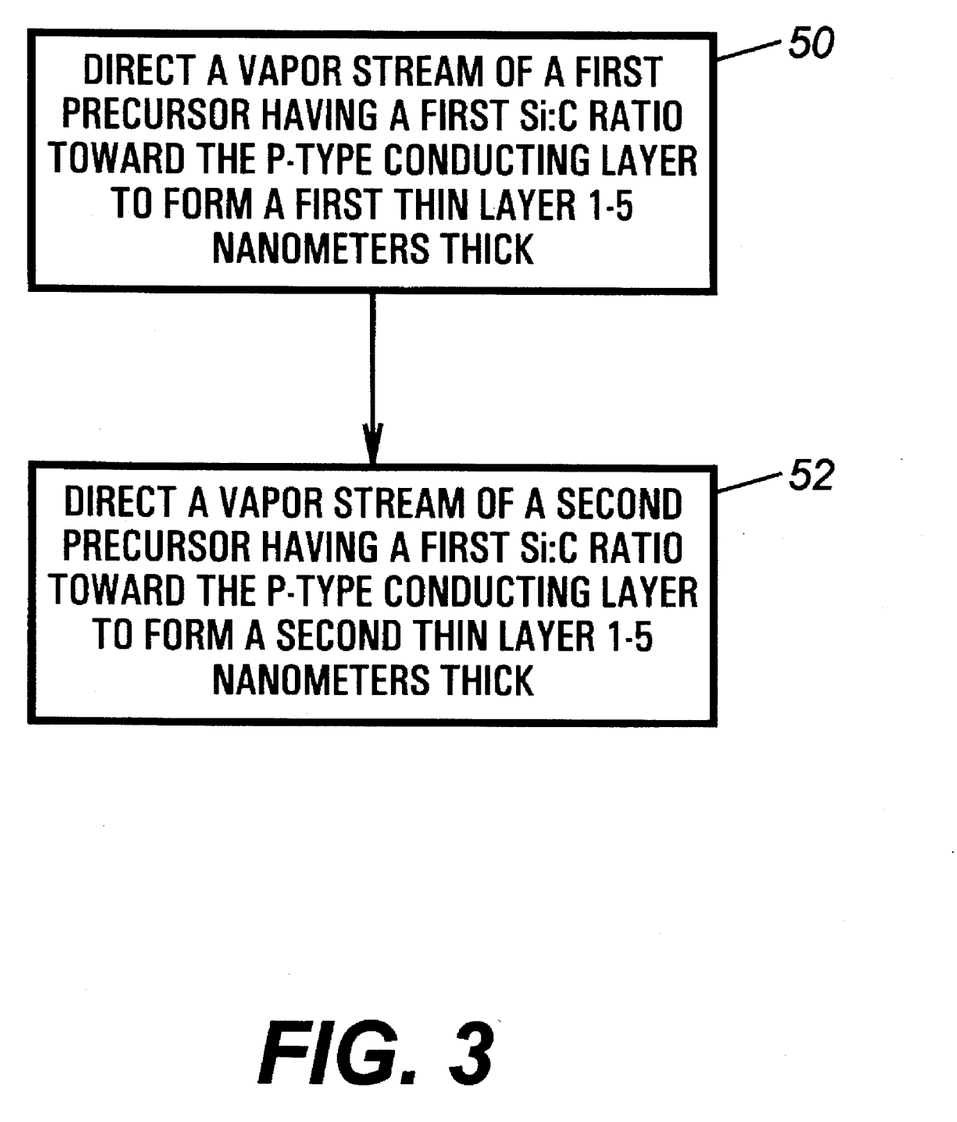
FIG. 3 is a block diagram of a method of the present invention using more than one selected precursor to control the silicon to carbon ratio in the siloxane film.

An example of this method using two precursors is shown in FIG. 3. This method involves directing a vapor stream from a first precursor having a first Si:C ratio toward the p-type conducting layer to form a first thin layer 1–5 nanometers thick, as shown in block 50 of FIG. 3, and then directing a vapor stream from a second precursor having a second Si:C ratio toward the p-type conducting layer to form a second thin layer 1–5 nanometers thick, as shown in block 52 of FIG. 3. It can be seen that n precursors having n Si:C ratios can be used to form n intermediate layers.

In the first embodiment of the present invention, the coated substrate may then be moved to a third work station. The steps carried out at the third work station are performed at vacuum conditions, as shown in FIG. 1c. The next step of the present invention, as shown in block 22 of FIG. 1c, is directing a vapor stream of carbonaceous precursor at the siloxane film.

The next step of the first embodiment of the present invention, as shown in block 24 of FIG. 1c, is exposing the siloxane film and precursor to a flux of atoms of a species suitable to produce an n-type conducting layer, such as antimony or phosphorus, above the siloxane film.

The next step of the present invention, as shown in block 26 of FIG. 1c, is bombarding the siloxane film precursor with a beam or argon or nitrogen ions for a sufficient amount of time to produce an n-type conductor layer with a low hydrogen content and high electronic conductivity. In a preferred embodiment, this conductor layer is 200–300 nanometers thick and the argon or nitrogen ions have an energy level of approximately 10 KeV. The hydrogen content should preferably be in the range of 1–10 atomic percent and the desired electronic conductivity should be at least 100/Ohm-cm. It is the intent of the present invention that the steps depicted in blocks 24 and 26 of FIG. 1c are performed simultaneously.

In a preferred embodiment of the present invention, the substrate is transported to a fourth work station where an evaporated stream of metal atoms, such as nickel, is deposited onto the n-type conductor layer in at least two defined strips, as shown in block 28 of FIG. 1c. The preferred method for the deposition of these conductor strips is by thermal evaporation from an electron beam heated hearth operating at a volatilization temperature of approximately 1200° C.

The second embodiment of the present invention is depicted in FIGS. 2a–2c. As shown in blocks 10 and 12 of FIG. 2a, the first two steps of the second embodiment of the present invention are the same as the first two steps of the first embodiment of the present invention. The next step of the second embodiment is exposing the conducting film and precursor to a flux of atoms of a species suitable to produce an n-type conducting layer, such as antimony or phosphorus, as shown in block 34 of FIG. 2a. This step is performed simultaneously with bombarding the conducting film and precursor with an ion beam having energies in the range of 1–20 KeV for a sufficient period of time to rupture a substantial number of C-H bonds in the precursor and to form an amorphous n-type carbonaceous residue having a thickness of 100–200 nanometers and a hydrogen content of 10–15 atomic percent. The steps depicted in blocks 12, 34, and 36 of FIG. 2a are performed at vacuum conditions, as shown in FIG. 2a.

In a preferred embodiment of the second embodiment of the invention, the substrate material is moved to a second work station where a vapor stream of siloxane precursor is directed toward the n-type conductor layer, as shown in block 38 of FIG. 2b. This step is performed simultaneously with bombarding the n-type conductor layer and precursor with a beam of hydrogen ions having energies in the range of 0.5–2.0 KeV for a sufficient period of time to produce a siloxane film comprising 10–15 atomic percent hydrogen and having a thickness of 500–1000 nonometers, as shown in block 40 of FIG. 2b. The steps shown in blocks 38 and 40 are performed at vacuum conditions, as shown in FIG. 2b.

In a preferred embodiment of the second embodiment of the invention, the substrate is moved to a third work station where a vapor stream of carbonaceous precursor is directed toward the siloxane film, as shown in block 22 of FIG. 2c. The next step of the second embodiment is exposing the siloxane film and precursor to a flux of atoms of a species suitable to produce a p-type conducting layer, such as boron, as shown in block 44 of FIG. 2c. This step is performed simultaneously with bombarding the precursor with a beam of argon or nitrogen ions for a sufficient amount of time to produce a p-type conductor layer with a hydrogen content of less than 10 atomic percent and an electronic conductivity of at least 100/Ohm-cm, as shown in block 46 of FIG. 2c.

In a preferred embodiment of the second embodiment, the substrate is moved to a fourth work station where an evaporated stream of metal atoms, such as nickel, is deposited onto the p-type conductor in at least two defined strips, as shown in block 48 of FIG. 2c. As shown in FIG. 2c, the steps depicted in blocks 22, 44, 46, and 48 are performed at vacuum conditions.

The present invention also encompasses the products produced by the methods disclosed herein, including the methods depicted in FIGS. 1a–1c and 2a–2c.

As previously explained, the temperature at which the present invention is practiced depends upon the precursor and substrate materials used. As shown in FIGS. 1a–1c and 2a–2c, a preferred temperature for practicing the present invention with hydrocarbon and siloxane precursors on a substrate coated with an ITO film is less than 80° C.

Many modifications and variations may be made in the embodiments described herein and depicted in the accompanying drawings without departing from the concept of the present invention. Accordingly, it is clearly understood that the embodiments described and illustrated herein are illustrative only and are not intended as a limitation upon the scope of the present invention.

What is claimed is:

1. A method for making a photovoltaic material, comprising the steps of:

(a) coating a substrate with a transparent conducting film;

(b) directing a vapor stream of carbonaceous precursor in a vacuum toward the conducting film;

(c) exposing the conducting film and precursor to a flux of atoms of a species suitable to produce a p-type conducting layer in the film in a vacuum;

(d) simultaneously with the exposing of step (c), bombarding the conducting film and precursor with an ion beam having energies in the range of about 1–20 KeV for a sufficient period of time to rupture a sufficient number of C-H bonds in the precursor and to form an amorphous p-type carbonaceous residue;

(e) directing a vapor stream of siloxane precursor toward the p-type conductor layer in a vacuum;

(f) simultaneously with the directing of step (e), bombarding the p-type conductor layer and siloxane precursor with a beam of hydrogen ions having energies in the range of about 0.5–2.0 KeV for a sufficient period of time to produce a siloxane film;

(g) directing a vapor stream of carbonaceous precursor at the siloxane film in a vacuum;

(h) exposing the carbonaceous precursor and siloxane film to a flux of atoms of a species suitable to produce an n-type conducting layer above the siloxane film in a vacuum;

(i) simultaneously with the exposing of step (h), bombarding the carbonaceous precursor with a beam of argon or nitrogen ions for a sufficient amount of time to produce an n-type conductor layer with a low-hydrogen content; and (j) depositing an evaporated stream of metal atoms onto the n-type conductor layer in at least two defined strips.

2. The method of claim 1, wherein the transparent conducting film is ITO.

3. The method of claim 1, wherein the carbonaceous precursor is a polyphenyl ether.

4. The method of claim 1, wherein the flux of atoms suitable to produce a p-type conductor layer are boron atoms.

5. The method of claim 1, wherein the amorphous p-type carbonaceous residue has a thickness of 100–200 nanometers.

6. The method of claim 1, wherein the ion beam used to bombard the siloxane film comprises argon ions.

7. The method of claim 1, wherein the amorphous p-type carbonaceous residue comprises approximately 10–15 atomic percent hydrogen and approximately 1–10 atomic percent boron.

8. The method of claim 1, wherein the siloxane film has a thickness in a range of 500–1000 nanometers.

9. The method of claim 1, wherein the siloxane film comprises 10–15 atomic percent hydrogen.

10. The method of claim 1, wherein the hydrogen content in the siloxane film is selectively controlled to control the optical band gap and the electrical resistivity in the siloxane film.

11. The method of claim 10, wherein the hydrogen content is controlled by controlling the magnitude of the hydrogen ion flux used to bombard the carbonaceous precursor.

12. The method of claim 10, wherein the hydrogen content is controlled by selecting a carbonaceous precursor with a desired carbon to hydrogen ratio.

13. The method of claim 1, wherein the siloxane film has an optical band gap of approximately 1.5 eV.

14. The method of claim 13, wherein the optical band gap of approximately 1.5 eV is achieved by controlling the ratio of silicon to carbon in the siloxane film.

15. The method of claim 14, wherein the ratio of silicon to carbon is controlled by:

(a) directing a vapor stream from a first siloxane precursor having a first silicon to carbon ratio toward the p-type conducting layer to form a first thin layer 1–5 nanometers thick; and (b) directing a vapor stream from a second siloxane precursor having a second silicon to carbon ratio toward the p-type conducting layer to form a second thin layer 1–5 nonometers thick.

16. The method of claim 1, wherein the bombardment of the siloxane film and carbonaceous precursor with a beam of argon and nitrogen ions is continued for a sufficient amount of time to produce an n-type conductor layer with a hydrogen content of less than 10 atomic percent hydrogen and an electronic conductivity of at least 100/Ohm-cm.

17. The method of claim 1, wherein the metal atoms are deposited onto the n-type conductor layer in at least two defined strips comprising nickel.

18. The product produced by the method of claim 1.

19. The method of claim 1, wherein the steps of directing a vapor stream of carbonaceous precursor in a vacuum toward the conducting film, exposing the conducting film and carbonaceous precursor to a flux of atoms of a species suitable to produce a p-type conducting layer, directing a vapor stream of siloxane precursor toward the p-type conductor layer, directing a vapor stream of carbonaceous precursor at the siloxane film, and exposing the carbonaceous precursor and siloxane film to a flux of atoms of a species suitable to produce an n-type conducting layer, are carried out at a temperature of less than 90° C.

20. A method for making a photovoltaic material, comprising the steps of:

(a) coating a substrate with a conducting film comprising ITO;

(b) directing a vapor stream of a low vapor pressure carbonaceous precursor in a vacuum toward the conducting film;

(c) exposing the conducting film and carbonaceous precursor to a flux of atoms of a species suitable to produce an n-type conducting layer in the film in a vacuum;

(d) simultaneously with the exposing of step (c), bombarding the conducting film and carbonaceous precursor with an ion beam having energies in the range of about 1–20 KeV for a sufficient period of time to rupture a sufficient number of C-H bonds in the carbonaceous precursor to form an amorphous n-type carbonaceous residue;

(e) directing a vapor stream of siloxane precursor toward the n-type conductor layer in a vacuum;

(f) simultaneously with the directing of step (e), bombarding the n-type conductor layer and siloxane precursor with a beam of hydrogen ions having energies in the range of about 0.5–2.0 KeV for a sufficient period of time to produce a siloxane film;

(g) directing a vapor stream of a low vapor pressure carbonaceous precursor at the siloxane film in a vacuum;

(h) exposing the carbonaceous precursor and siloxane film to a flux of atoms of a species suitable to produce a p-type conducting layer above the siloxane film in a vacuum;

(i) simultaneously with the exposing of step (h), bombarding the carbonaceous precursor with a beam of argon or nitrogen ions for a sufficient amount of time to produce a p-type conductor layer with a low-hydrogen content; and (j) depositing an evaporated stream of metal atoms onto the p-type conductor layer in at least two defined strips.

21. The method of claim 20, wherein the flux of atoms suitable to produce an n-type conducting layer are antimony atoms.

22. The method of claim 21, wherein the siloxane precursor is selected to control the silicon to carbon ratio in the siloxane film in order to achieve a desired optical band gap in the film.

23. The method of claim 22, wherein the optical band gap achieved is approximately 1.5 eV.

24. The product produced by the method of claim 19.

25. The method of claim 20, wherein the steps of directing a vapor stream of a low vapor pressure carbonaceous precursor toward the conducting film, exposing the conducting film and carbonaceous precursor to a flux of atoms of a species suitable to produce an n-type conducting layer, directing a vapor stream of siloxane precursor toward the n-type conducting layer, directing a vapor stream of a low vapor pressure carbonaceous precursor at the siloxane film, and exposing the carbonaceous precursor and siloxane film to a flux of atoms of a species suitable to produce a p-type conducting layer are performed at a temperature of less than 90° C.

* * * * *